United States Patent
Liang

(10) Patent No.: US 8,964,499 B2
(45) Date of Patent: Feb. 24, 2015

(54) ROW DECODING CIRCUIT

(71) Applicant: Winbond Electronics Corp., Taichung (TW)

(72) Inventor: Chih-Wei Liang, Hsinchu County (TW)

(73) Assignee: Winbond Electronics Corp., Taichung (TW)

( * ) Notice: Subject to any disclaimer, the term of this patent is extended or adjusted under 35 U.S.C. 154(b) by 122 days.

(21) Appl. No.: 13/773,609

(22) Filed: Feb. 21, 2013

(65) Prior Publication Data
US 2014/0233340 A1    Aug. 21, 2014

(51) Int. Cl.
*G11C 7/00* (2006.01)
*G11C 8/10* (2006.01)

(52) U.S. Cl.
CPC .......... *G11C 8/10* (2013.01)
USPC .............. 365/230.06; 365/230.03

(58) Field of Classification Search
CPC .................. G11C 8/12; G11C 8/08
USPC ....................... 365/230.03, 230.06
See application file for complete search history.

(56) References Cited

U.S. PATENT DOCUMENTS

| 4,827,160 | A | 5/1989 | Okano |
| 4,851,716 | A | 7/1989 | Needles et al. |
| 5,442,380 | A | 8/1995 | McCormick |
| 7,570,540 | B2 * | 8/2009 | Nii ........................ 365/230.05 |
| 7,613,062 | B2 * | 11/2009 | Nakano et al. .............. 365/225.7 |
| 7,706,184 | B2 * | 4/2010 | Hamada .................... 365/185.12 |
| 8,724,391 | B2 * | 5/2014 | Nakamura et al. ........ 365/185.17 |
| 8,730,722 | B2 * | 5/2014 | Koh et al. ................. 365/185.03 |

* cited by examiner

*Primary Examiner* — Michael Tran
(74) *Attorney, Agent, or Firm* — Jianq Chyun IP Office

(57) ABSTRACT

A row decoding circuit including row decoding blocks is provided. Each of the row decoding blocks includes row decoders. Each of the row decoders receives a pre-charge signal, and includes an inverter, a selecting transistor and at least one switch transistors. The inverter receives the corresponding pre-charge signal, and outputs a first control signal. The first source/drain of the selecting transistor is coupled to a system high voltage, the gate receives the first control signal, and the second source/drain outputs a corresponding row selecting signal to a memory array of a memory device. The switch transistors are coupled between the second source/drain of the selecting transistor and a corresponding first reference signal in series. When the selecting transistor is controlled by the first control signal and turned on, the first reference signal is set to a high voltage level.

17 Claims, 5 Drawing Sheets

| Signal | FIG. 3A | FIG. 3B |
|---|---|---|
| s_blk1 | L | L |
| s_prch1 | H | H |
| s_c1 | L | L |
| s_c21 | H | L |
| s_c22 | H | L |
| s_c23 | H | L |
| s_rsel11 | H | H |
| s_ref1 | H | H |

ROW DECODING CIRCUIT

BACKGROUND

1. Field of the Invention

The present invention is directed to a memory device and more particularly, to a row decoding circuit applicable to a memory device.

2. Description of Related Art

A memory array in a memory device is composed of a plurality of memory cells. When multiple data is about to be stored in the memory array or the data is to be read from the memory array, the memory device enables corresponding row selecting signals according to memory addresses corresponding to the data to open the memory cells on a corresponding word line. Thus, the data can be stored into or read from the corresponding memory cells. Therefore, in the application of the memory technology, a plurality of row selecting signals is generated by a plurality of row decoders, and a voltage level of each row selecting signal is determined by the row decoder according to the memory address.

Typically, a row decoder is formed by cascoding a plurality of transistors, and sub-threshold leakage, gate direct tunneling leakage and gate induce drain leakage (GIDL) occurring in the transistors would influence the power consumption of the row decoder. Accordingly, how to reduce the leakage of the transistors has become an important subject of designing the row decoders of the memory device.

SUMMARY

The present invention is directed to a row decoding circuit capable of reducing leakage of row decoders without increasing an area of the circuit.

The present invention provides a row decoding circuit applicable to a memory device and including a plurality of row decoding blocks. Each of the row decoding blocks includes a plurality of row decoders. Each of the row decoders receives a corresponding pre-charge signal and includes an inverter, a selecting transistor and at least one switch transistors. The inverter receives a corresponding pre-charge signal and outputs a first control signal. A first source/drain of the selecting transistor is coupled to a system high voltage, a gate of the selecting transistor receives the first control signal, and a second source/drain of the selecting transistor outputs a corresponding row selecting signal to a memory array of the memory device. The switch transistors are coupled in series between the second source/drain of the selecting transistor and a corresponding first reference signal, and a gates of each switch transistors respectively receives a corresponding second control signal. When the selecting transistor is controlled by the first control signal and turned on, the first reference signal is set to a high voltage level.

To sum up, according to the embodiments of the present invention, a row decoding circuit is provided. When a row selecting signal at a high voltage level is output by a row decoder, the first reference signal at a high voltage level is provided, such that a sub-threshold leakage of the switch transistor is suppressed to mitigate the impact of the leakage on the voltage level of the row selecting signal and to reduce power consumption of the memory device.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

FIG. 3A-3D are timing sequence diagrams of signals of a row decoder according to an embodiment of the present invention.

DESCRIPTION OF EMBODIMENTS

Figure 1:
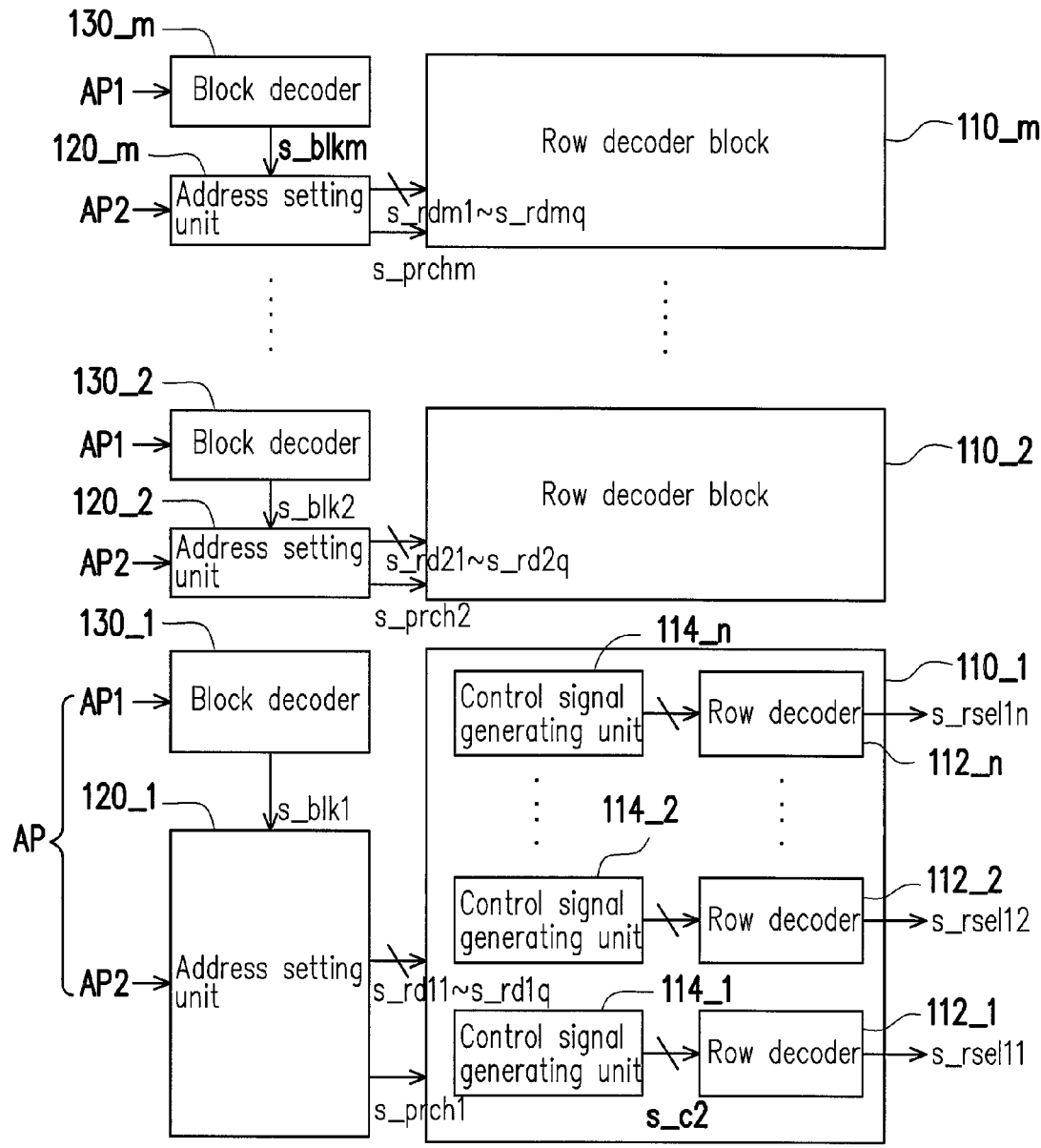
FIG. 1 is a schematic diagram illustrating a row decoding circuit according to an embodiment of the present invention.

FIG. 1 is a schematic diagram illustrating a row decoding circuit according to an embodiment of the present invention. A row decoding circuit 100 of the present embodiment is adaptive for various types of memory devices, such as a dynamic random access memory (DRAM) or a static random access memory (SRAM), and configured to generate a plurality of row selecting signals (e.g. s_rsel11~s_rsel1n) after decoding memory addresses so as to drive a memory array of a memory device.

Referring to FIG. 1, in the present embodiment, the row decoding circuit 100 includes a plurality of row decoding blocks 110_1~110_m, a plurality of address setting units 120_1~120_m and a plurality of block decoders 130_1~130_m. Therein, the block decoders 130_1~130_m respectively generate block selecting signals s_blk1~s_blkm corresponding to the row decoding blocks 110_1~110_m according to a first portion AP1 of a memory address AP. The address setting units 120_1~120_m respectively receive the corresponding block selecting signals s_blk1~s_blkm and a second portion AP2 of the memory address AP to correspondingly generate a plurality of address reference signals s_rd11~s_rd1$q$, s_rd21~s_rd2$q$, ... and s_rdm1~s_rdmq and a plurality of pre-charge signals s_prch1~s_prchm.

Here, the first portion AP1 and the second portion AP2 of the memory address AP may be a high-bit portion of the memory address AP and a low-bit portion the memory address AP, respectively. For example, when the memory address AP is composed of a plurality of memory address bits (e.g. A0~Ak), the first portion AP1 (the high-bit portion) may be composed of the memory address bits A6~Ak, while the second portion AP2 (the low-bit portion) may be composed of the memory address bits A0~A5, wherein k is a positive integer. Additionally, values of m and n as indicated above may be set according to the size and circuit configuration of the memory array of the memory device.

Each of the row decoding blocks 110_1~110_m includes a plurality of row decoders (e.g. 112_1~112_n) and a plurality of control signal generating units (e.g. 114_1~114_n). In the present embodiment, each of the row decoding blocks 110_1~110_m has substantially the same structure, and thus, the row decoding block 110_1 is illustrated as an example hereinafter. The row decoding block 110_1 includes the row decoders 112_1~112_n and the control signal generating units 114_1~114_n. The control signal generating unit (e.g. 114_1~114_n) is coupled to the corresponding address setting unit (e.g. 120_1~120_n) to receive the corresponding address reference signal (e.g. s_rd11~s_rd1$q$, s_rd21~s_rd2$q$ and s_rdm1~s_rdmq) and output a plurality of second control signals (such as a second control signal s_c2), wherein a value of q may be set according to the circuit configuration of the row decoders (e.g. 112_1~112_n). Thus, each of the row decoders (e.g. 112_1~112_n) may generate the corresponding row selecting signal (e.g. s_rsel11~s_rsel1n) according to the corresponding pre-charge signal (e.g. s_prch1~s_prchm) and the corresponding second control signals (such as the second control signal s_c2).

Figure 2:
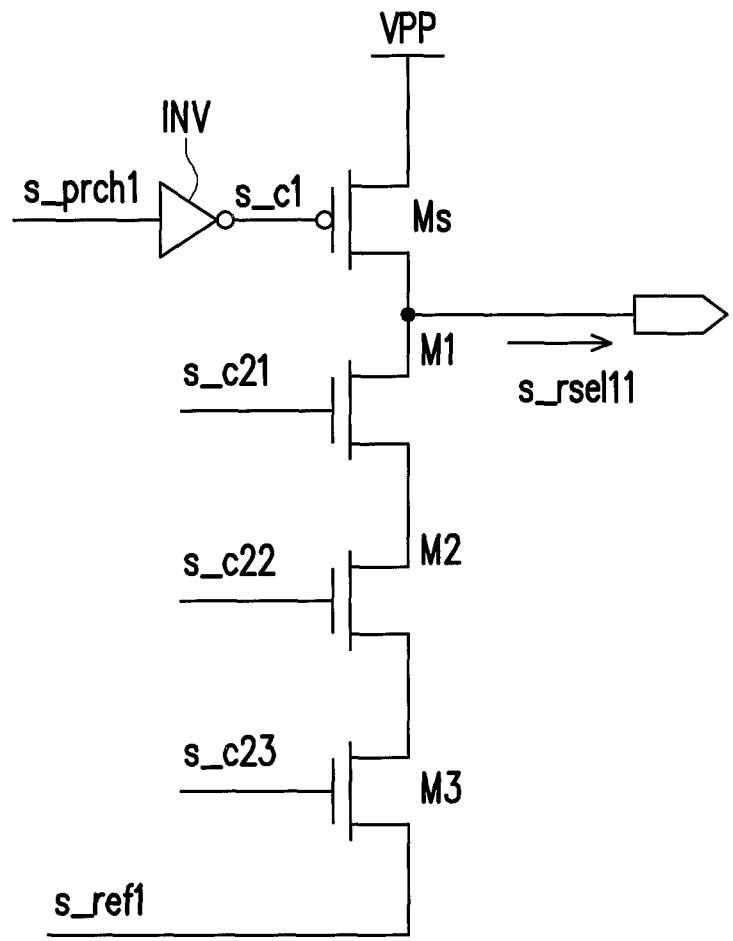
FIG. 2 is a schematic diagram illustrating a row decoder according to an embodiment of the present invention.

FIG. 2 is a schematic diagram illustrating a row decoder according to an embodiment of the present invention. Each of the row decoders 112_1~112_n has substantially the same structure, and the row decoding block 110_1 is illustrated as an example hereinafter. Referring to FIG. 2 with FIG. 1, in the present embodiment, the row decoder 112_1 includes an inverter NV, a selecting transistor Ms and three switch transistors (e.g. M1~M3). The selecting transistor Ms is a P-type transistor, and the switch transistors M1~M3 are N-type transistors, for example. Additionally, the number of the switch transistors (e.g. M1~M3) may be varied as one or more according to the requirements of the circuit configuration, but the present invention is not limited thereto.

The inverter NV receives the corresponding pre-charge signal s_prch1 and outputs a first control signal s_c1. A first source/drain of the selecting transistor Ms is coupled to a system high voltage VPP, a gate of the selecting transistor Ms receives the first control signal s_c1 and a second source/drain of the selecting transistor Ms outputs the corresponding row selecting signal r_sel11. The switch transistors M1~M3 are coupled in series between the second source/drain of the selecting transistor Ms and the corresponding first reference signal s_ref1, and a gate of each of the switch transistors M1~M3 receives one of the corresponding second control signals s_c21~s_c23 from the control signal generating unit 114_1. Therein, a second source/drain of the switch transistor M3 receives the corresponding first reference signal s_ref1.

It is to be noticed that the present invention is not intent to limit the types of the selecting transistor Ms and the types of the switch transistors M1~M3. In other embodiments, the selecting transistor Ms and the switch transistors M1~M3 may be implemented by transistors of the same type or of the different types. Besides, the circuitry of the row decoder 112_1 depicted in FIG. 2 is only an example, and in the practical application, each of the row decoders 112_1~112_n may receive the first control signal s_sc1 by commonly using the inverter INV. In other words, the present invention is not intent to limit that each of the row decoders 112_1~112_n necessarily includes the inverter INV.

Specifically, the row decoding circuit 100 may select one of the row decoding blocks 110_1~110_m according to the first portion AP1 of the memory address AP and further enables one of the row selecting signals (e.g. s_rsel11~s_rsel1n) generated by the row decoders (e.g. 112_1~112_n) of the row decoding block selected form the row decoding blocks 110_1~110_m according to the second portion AP2 of the memory address AP. In the present embodiment, the enabled row selecting signal (e.g. one of s_rsel11~s_rsel1n) is at a low voltage level, while the disabled row selecting signal (e.g. one of s_rsel11~s_rsel1n) is at a high voltage level, for example.

Figure 3C:
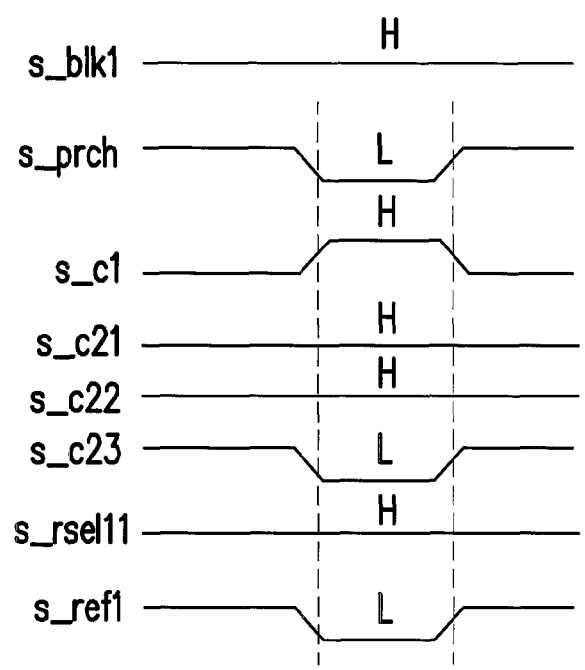

FIG. 3A~3D are timing sequence diagrams of signals of a row decoder according to an embodiment of the present invention. Referring to FIG. 3A with FIG. 1 and FIG. 2, FIG. 3A illustrates an embodiment of the voltage level of each signal when the row decoding block 110_1 corresponding to the row decoder 112_1 is unselected. When the row decoding block 110_1 is unselected, the block decoder 130_1 outputs a low-level block selecting signal s_blk1 to the address setting unit 120_1 according to the first portion AP1 of the memory address AP. At this time, the address setting units 120_1 correspondingly outputs the high-level address reference signals s_rd11~s_rd1q to the control signal generating units 114_1~114_n and outputs the high-level pre-charge signal s_prch1 (i.e. the disabled pre-charge signal s_prch1) to the row decoders 112_1~112_n, and the control signal generating units 114_1~114_n generate the high-level second control signals s_c21~s_c23 according to the high-level address reference signals s_rd11~s_rd1q.

In the embodiments of the present invention, the first reference signal s_ref1 may be generated by the block decoder 130_1 or the address setting unit 120_1 and set to a high voltage level according to the high-level block selecting signal s_blk1. A high and a low voltage levels of the first reference signal s_ref1 may respectively correspond to a transistor turn-on voltage VTT and a ground voltage GND, a high and a low voltage levels of the pre-charge signal s_prch1 may respectively correspond to a system high voltage VPP and a ground voltage GND, and a high and a low voltage levels of the second control signals s_c21~s_c23 may respectively correspond to a transistor turn-on voltage VTT and a ground voltage GND. Therein, the transistor turn-on voltage VTT is lower than the system high voltage VPP and higher than a threshold voltage of the switch transistors (e.g. M1~M3).

At this time, the inverter INV receives the high-level pre-charge signal s_prch1 and outputs the first control signal s_c1 having a low voltage level to the gate of the selecting transistor Ms so as to turn on the selecting transistor Ms. Meanwhile, since the first reference signal s_ref1 received by the second source/drain of the switch transistor M3 is set to the high voltage level and the second control signals s_c21~s_c23 received by the switch transistors M1~M3 are at the high voltage level, the switch transistors M1~M3 are turned off. Thus, the row selecting signal s_rsel11 is at the high voltage level (i.e. at the system high voltage VPP).

In other words, when the row decoding blocks 110_1 corresponding to each of the row decoders 112_1~112_n is unselected according to the first portion AP1 of the memory address AP, the corresponding pre-charge signal s_prch1, the corresponding first reference signal s_ref1 and the corresponding second control signals s_c21~s_c23 of each of the row decoders 112_1~112_n are at a high voltage level, and the selecting transistor Ms is controlled by the first control signal s_c1 and turned on. At this time, a voltage difference between the first source/drain of the switch transistor M1 and the second source/drain of the switch transistor M3 is reduced, and a voltage difference between the first source/drain and the gate of each of the switch transistors M1~M3 is reduced. Thus, leakages, such as sub-threshold leakage, gate direct tunneling leakage gate and gate induce drain leakage (GIDL), of the switch transistors M1~M3 may be reduced.

FIG. 3B illustrates another embodiment of the voltage level of each signal when the row decoding block 110_1 corresponding to the row decoder 112_1 is unselected. In the present embodiment, the difference from the embodiment of FIG. 3A lies in that when the row decoding block 110_1 is unselected, the control signal generating units 114_1 generates the second control signals s_c21~s_c23 that are all at the low level, but since the voltage difference between the first source/drain of the switch transistor M1 and the second source/drain of the switch transistor M3 is reduced, the leakages of the switch transistors M1~M3 may still be reduced.

Referring to FIG. 3C with FIG. 1 and FIG. 2, FIG. 3C illustrates the voltage level of each signal when the row decoding block 110_1 corresponding to the row decoder 112_1 is selected while the row decoder 112_1 is unselected. When the row decoding block 110_1 corresponding to the row decoder 112_1 is selected while the row decoder 112_1 is unselected, the block decoder 130_1 corresponding to the row decoding block 110_1 outputs the high-level block selecting signal s_blk1 to the address setting unit 120_1 according to the first portion AP1 of the memory address AP.

At this time, the address setting unit 120_1 correspondingly outputs the second portion AP2 of the memory address AP to the corresponding control signal generating units 114_1~114_n, which is used as the address reference signals s_rd11~s_rd1q, and outputs the low-level pre-charge signal s_prch1 (i.e. the enabled pre-charge signal s_prch1) to the row decoding block 110_1.

The control signal generating unit 114_1 generates the second control signals s_c21~s_c23 according to the corresponding address reference signals s_rd11~s_rd1q, and the first reference signal s_ref1 is set to a low voltage level according to the low-level pre-charge signal s_prch1. Since the row decoder 112_1 is unselected, the control signal generating unit 114_1 is control by the address reference signals s_rd11~s_rd1q to generate the second control signals s_c21~s_c23, and at least one of the second control signals s_c21~s_c23 is at the low voltage level. Herein, the second control signal s_c23 is illustrated as an example, but the present invention is not limited thereto.

When receiving the low-level pre-charge signal s_prch1, the inverter INV outputs the first control signal s_c1 having the high voltage level to the gate of the selecting transistor Ms so as to turn off the selecting transistor Ms. At this time, the first reference signal s_ref1 received by the second source/drain of the switch transistor M3 is correspondingly set to the low voltage level. However, since at least one of the switch transistors M1~M3 is turned off by at least one of the second control signals s_c21~s_c23 generated by the control signal generating unit 114_1 is low-level, the row selecting signal s_rsel11 output by the row decoder 112_1 is still considered as high-level.

Figure 3D:
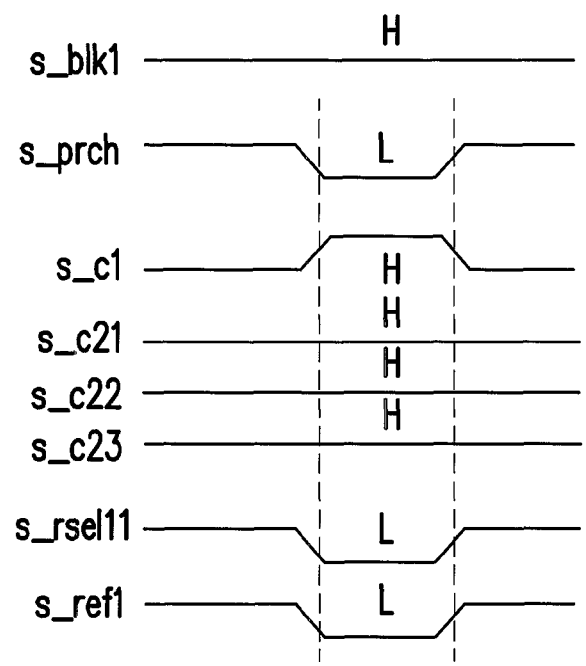

On the other hand, if the row decoder 112_1 is selected, the row selecting signal s_rsel11 output therefrom is enabled (e.g. at a low voltage level). Referring to FIG. 3D with FIG. 1 and FIG. 2, FIG. 3D illustrates the voltage level of each signal when the row decoding block 110_1 corresponding to the row decoder 112_1 is selected and the row decoder 112_1 is selected. When the row decoding block 110_1 is selected and the row decoder 112_1 is also selected, the address setting units 120_1 outputs the low-level pre-charge signal s_prch1 to the row decoding blocks 110_1, the control signal generating unit 114_1 generates the second control signals s_c21~s_c23 that are all high-level according to the address reference signals s_rd11~s_rd1q, and the first reference signal s_ref1 is set to a low voltage level corresponding to the low-level pre-charge signal s_prch1.

When receiving the low-level pre-charge signal s_prch1, the inverter INV outputs the first control signal s_c1 having the high voltage level to the gate of the selecting transistor Ms to turn off the selecting transistor Ms. At this time, since the first reference signal s_ref1 is set to the low voltage level, and all the second control signals s_c21~s_c23 are at the high voltage level, such that all the switch transistors M1~M3 are turned on. Thus, the voltage level of the row selecting signal s_rsel1 is dropped down to the ground voltage GND (i.e. the low voltage level).

In addition, in the present embodiment, a bulk of each of the switch transistors M1~M3 may be coupled to a corresponding second source/drain or the ground voltage GND. By coupling the bulks of the switch transistors M1~M3 to the ground voltage GND, the threshold voltage of each of the switch transistors M1~M3 may be prevented from being changed by the influence from the change of the voltage level of the first reference signal s_ref1.

Figure 4:
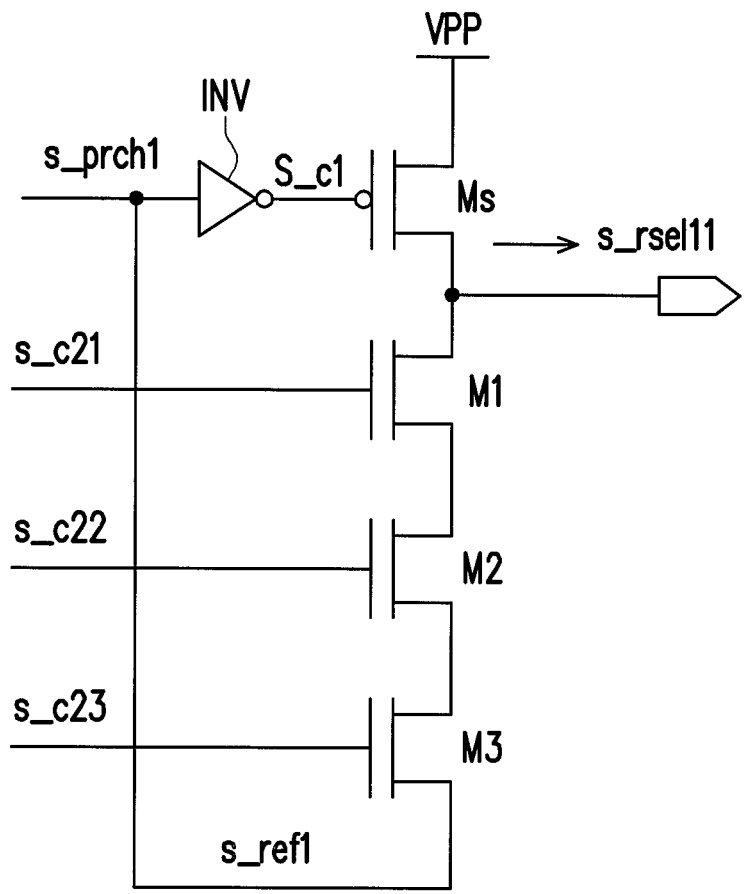
FIG. 4 is a schematic diagram illustrating a row decoder according to another embodiment of the present invention.

FIG. 4 is a schematic diagram illustrating a row decoder according to another embodiment of the present invention. Referring to FIG. 4, in the present embodiment, a row decoder 412 includes the inverter INV, the selecting transistor Ms and the switch transistors M1~M3. The selecting transistor Ms is a P-type transistor, and the switch transistors M1~M3 are N-type transistors. The circuitry and operation method of the row decoder 412 are the same as what has been described according to the embodiment of FIG. 2. The present embodiment and the embodiment of FIG. 2 mainly differ in that the voltage of the first reference signal s_ref1 in the row decoder 412 is set by coupling the second source/drain of the switch transistor M3 to a input terminal of the inverter INV to receive the pre-charge signal s_prch1.

In other words, the first reference signal s_ref1 received by the row decoder 412 is the pre-charge signal s_prch1, and thus, in the previously described operation method, the high voltage level of the first reference signal s_ref1 corresponds to the system high voltage VPP.

Under such architecture, the voltage difference between the first source/drain of the switch transistor M1 and the second source/drain of the switch transistor M3 may further tends to 0. Accordingly, under the circuitry of the row decoder 412, the problem of the sub-threshold leakage of each of the switch transistors M1~M3 may be effectively suppressed.

It should be noticed that in the situation where the first reference signal s_ref is the pre-charge signal s_prch1, the high voltage level of each of the second control signals s_c21~s_c23 may correspond to the system high voltage VPP or the transistor turn-on voltage VTT. In addition, the timing sequence of signals and operation method of the row decoder 412 may also refer to the descriptions regarding FIG. 2 and FIG. 3A~3D and thus, will not be repeated hereinafter.

In light of the forgoing, the embodiments of the present invention are directed to a row decoding circuit providing a high-level first reference signal when the row decoder outputs a high-level row selecting signal so as to suppress sub-threshold leakage which is possibly generated by switch transistors. Additionally, in the row decoding circuit according to the embodiments of the present invention, by providing a highs-level second control signal to the switch transistors, gate direct tunneling leakage and gate induce drain leakage (GIDL) of each switch transistor may be prevented so as to mitigate the impact of the leakages on the voltage level of the row selecting signal and reduce power consumption of the memory device.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A row decoding circuit, applicable to a memory device, comprising:
a plurality of row decoding blocks, each of the row decoding blocks comprising a plurality of row decoders, and each of the row decoders comprising:
a selecting transistor, having a first source/drain coupled to a system high voltage, a gate receiving a first control signal and a second source/drain outputting a corresponding row selecting signal to a memory array of the memory device; and
at least one switch transistors, coupled in series between the second source/drain of the selecting transistor and a corresponding first reference signal, and each of the switch transistors having a gate receiving a corresponding second control signal,
wherein when the selecting transistor is controlled by the first control signal and turned on, the first reference signal is set to a high voltage level
wherein each of the row decoding blocks further comprises:
an inverter, coupled to the row decoders in a corresponding one of the row decoding blocks, and receiving a pre-charge signal and outputting the first control signal.

2. The row decoding circuit according to claim 1, wherein the selecting transistor is a P-type transistor, and the at least one switch transistors is a N-type transistor.

3. The row decoding circuit according to claim 2, wherein when each of the row decoding blocks is unselected according to a first portion of a memory address, the pre-charge signal and the first reference signal corresponding to each of the row decoders of the unselected decoding block are at the high voltage level.

4. The row decoding circuit according to claim 3, wherein when each of row decoding blocks is selected, the pre-charge signal and the first reference signal corresponding to each of the row decoders of the selected decoding block are at a low voltage level.

5. The row decoding circuit according to claim 4, the first reference signal corresponding to each of the row decoders is the pre-charge signal corresponding to each of the row decoders.

6. The row decoding circuit according to claim 4, wherein when the row decoding block corresponding to each of the row decoders is unselected, the second control signals corresponding to the each of the row decoders are at the low voltage level.

7. The row decoding circuit according to claim 5, wherein when the row decoding block corresponding to each of the row decoders is unselected, the second control signals corresponding to the each of the row decoders are at the high voltage level.

8. The row decoding circuit according to claim 4, wherein the high voltage level of the pre-charge signal corresponds to the system high voltage, the high voltage level of the first reference signal corresponds to a transistor turn-on voltage, and the low voltage level of the pre-charge signal and the first reference signal correspond to a ground voltage, wherein the transistor turn-on voltage is lower than the system high voltage, but higher than a threshold voltage of the at least one switch transistors.

9. The row decoding circuit according to claim 8, wherein when the row decoding block corresponding to each of the row decoder is unselected, the second control signal corresponding to the each of the row decoders is at the low voltage level.

10. The row decoding circuit according to claim 8, wherein when the row decoding block corresponding to each of the row decoders is unselected, the second control signals corresponding to the each of the row decoders are at the high voltage level.

11. The row decoding circuit according to claim 4, wherein when the row decoding block corresponding to each of the row decoders is selected and the each of the row decoders is unselected according to a second portion of the memory address, at least one of the second control signals corresponding to the each of the row decoders is at the low voltage level.

12. The row decoding circuit according to claim 11, wherein when the row decoding block corresponding to each of the row decoders is selected and the each of the row decoders is selected according to the second portion of the memory address, the second control signals corresponding to the each of the row decoders are at the high voltage level.

13. The row decoding circuit according to claim 12, wherein when the first portion of the memory address is a high-bit portion of the memory address, the second portion of the memory address is a low-bit portion of the memory address.

14. The row decoding circuit according to claim 4, wherein each of the row decoding blocks further comprises a plurality of control signal generating units respectively coupled to the corresponding row decoder, and each of the control signal generating units receives a plurality of address reference signals so as to output the corresponding second control signals.

15. The row decoding circuit according to claim 14, further comprising:
a plurality of address setting units, each of the address setting units receiving a corresponding block selecting signal and a second portion of the memory,
wherein when each of the row decoding blocks is selected, each of the address setting units corresponding to the selected row decoding block is controlled by the corresponding block selecting signal to output the second portion of the memory address to the corresponding control signal generating units, which is used as the corresponding address reference signals, and output the low-level pre-charge signal to the selected row decoding block, and
wherein when each the row decoding blocks is unselected, each of the address setting units corresponding the unselected row decoding block is controlled by the corresponding block selecting signal to output the high-level address reference signal to the corresponding control signal generating unit and output the high-level pre-charge signal to the unselected row decoding block.

16. The row decoding circuit according to claim 15, further comprising:
a plurality of block decoders, receiving the first portion of the memory address and respectively outputting a corresponding block selecting signal, wherein the block decoders output the low-level block selecting signals to the corresponding address setting units of the unselected row decoding blocks according to the first portion of the memory address, and wherein the block decoders output the high-level block selecting signal to the corresponding address setting unit of the selected row decoding block according to the first portion of the memory address.

17. The row decoding circuit according to claim 1, wherein the switch transistor of each of the row decoders has a bulk coupled to a ground voltage.

* * * * *